(12) United States Patent
Suda

(10) Patent No.: US 6,911,606 B2
(45) Date of Patent: Jun. 28, 2005

(54) ELECTRONIC COMPONENT FOR ADHESION OF A PLURALITY OF ELECTRODES AND METHOD OF MOUNTING THE SAME

(75) Inventor: Yushi Suda, Granestate 201,2-72 Turugamine, Asahi-ku, Yokohama-shi, Kanagawa-ken (JP)

(73) Assignees: Yushi Suda, Kanagawa-ken (JP); Life Co., Ltd., Tokyo (JP); Kosho Corp., Kanagawa-ken (JP)

( * ) Notice: Subject to any disclaimer, the term of this patent is extended or adjusted under 35 U.S.C. 154(b) by 0 days.

(21) Appl. No.: 10/791,876

(22) Filed: Mar. 4, 2004

(65) Prior Publication Data

US 2004/0173372 A1 Sep. 9, 2004

(30) Foreign Application Priority Data

Mar. 4, 2003 (JP) ........................................ 2003-056587

(51) Int. Cl.[7] ................................................. H05K 1/02
(52) U.S. Cl. .......................................... 174/259; 29/830
(58) Field of Search ................................ 174/259, 260; 439/65–75; 29/830

(56) References Cited

U.S. PATENT DOCUMENTS

| | | | | |
|---|---|---|---|---|
| 5,162,613 A | * | 11/1992 | Schoenthaler | 174/88 R |
| 6,246,013 B1 | * | 6/2001 | Yoshida et al. | 174/260 |
| 6,288,906 B1 | * | 9/2001 | Sprietsma et al. | 361/772 |
| 6,461,896 B1 | * | 10/2002 | Imasu et al. | 438/108 |
| 6,504,104 B2 | * | 1/2003 | Hacke et al. | 174/254 |
| 6,512,183 B2 | * | 1/2003 | Mitani et al. | 174/257 |
| 6,538,896 B2 | * | 3/2003 | Kameda et al. | 361/752 |
| 6,592,783 B2 | * | 7/2003 | Kumakura et al. | 439/66 |
| 6,629,363 B1 | * | 10/2003 | Chan | 29/832 |
| 6,634,098 B1 | * | 10/2003 | Kinsman et al. | 29/835 |
| 6,717,819 B1 | * | 4/2004 | Chung | 367/760 |
| 6,770,822 B2 | * | 8/2004 | Pasternak et al. | 174/260 |

FOREIGN PATENT DOCUMENTS

JP 2002-299809 10/2002

* cited by examiner

Primary Examiner—Dean A. Reichard
Assistant Examiner—Adolfo Nino
(74) Attorney, Agent, or Firm—Wenderoth, Lind & Ponack, L.L.P.

(57) ABSTRACT

A chip cover with an insulative property and having a radiating portion has a housing portion on its lower surface. A flip chip piece, which has an electrode surface on which a plurality of projected electrodes of a semiconductor are arranged on its back surface, is accommodated in the housing portion. An anisotropic conductive adhesive agent is applied or printed to the electrode surface of the chip piece to embed the projected electrodes, and an insulative adhesive agent is applied or printed in a thicker configuration to a bonding surface which is provided on a lower surface of the chip cover and around the chip piece to embed the projected electrodes. The anisotropic conductive adhesive agent and the insulative adhesive agent are heat-pressed to be temporarily cured.

17 Claims, 6 Drawing Sheets

ELECTRONIC COMPONENT FOR ADHESION OF A PLURALITY OF ELECTRODES AND METHOD OF MOUNTING THE SAME

BACKGROUND OF THE INVENTION

Field of the Invention

The present invention relates to electronic component (electronic part or electronic device) for connecting a plurality of electrodes for increasing an adhesive force of chip pieces, particularly flip chip pieces, composed of semiconductor elements for use in display panels, various kinds of modules, and also relates to a method of mounting (that is, packaging) the electronic component.

Conventionally, various kinds of electronic component of semiconductor have been mounted on a circuit board to provide various kinds of circuit modules. However, the electronic component are different from each other in mounting structure depending upon their configuration, and when the electronic component of various kinds of chip pieces, such as of an SIP type and a QFP type having long-legged terminals and boarding wires, are used, most of them have been mounted by using a soldering technique.

Along with miniaturization and thinning of electronic devices and appliances such as LC (liquid crystal) panels, IC cards, etc., requirements have been made for miniaturization and thinning of the electronic component of semiconductors. Therefore, flip chip pieces (hereinafter referred to simply as "chip piece(s)") which are formed by exposing projecting terminals (bumps) on a back surface of a planar-shaped chip piece have been used extensively instead of the first-mentioned chip pieces.

Although mounting of the chip pieces can be made by a soldering technique as in the conventional mounting technique, a serious short-circuit problem has been encountered if a pitch or distance of the adjacent electrode terminals is not large enough. Besides, the chip pieces are mounted in such a manner that a plurality of substrate electrodes on the circuit board are positioned in a confronting relation with a plurality of electrodes on the chip pieces so that the electrodes of the circuit board and the electrodes of the chip pieces are aligned and connected with each other. However, since these electrodes are not always aligned correctly and/or there are so many contact points, there is a problem of an undesirable connection, resulting in a low yield rate. Further, the undesired component in which solders are undesirably fixed are not re-usable, resulting in economic inefficiency and poor productivity. In view of these disadvantages, anisotropic conductive adhesives have recently been used extensively since these adhesives are relatively easily applicable in mounting of the chip pieces.

As shown in FIG. 17, in a case that a flip type chip piece 50 having electrodes 52 on a electrode surface 51 is mounted on a circuit board by using an anisotropic conductive adhesive, the anisotropic conductive adhesive S, as a base resin, is applied to the substrate electrodes 56 which have been disposed on the circuit board 55 in an alignment relation with the electrodes 52. Then, as shown in FIG. 18, the electrodes 52 of the chip piece 50 are aligned, in a confronting relation, with the substrate electrodes 56 on the circuit board 55, and heat-pressed by a known crimp tool X from above the chip pieces 50 to thereby vertically press the anisotropic conductive adhesive S to accomplish the mounting operation. FIG. 19 shows a resultant circuit module produced by the steps and process described above. This is shown in, for example, Japanese Unexamined Publication No. 2002-299809.

However, the anisotropic conductive adhesive S is prepared by adding conductive fine powder of metal such as gold, silver, copper, nickel or the like to an insulative epoxy type resins. Therefore, if pressure is added to the adhesive, a conductive property is produced only in the direction of the added pressure, with an unpressurized direction thereof being left insulative.

Accordingly, the anisotropic conductive adhesive is extremely effective to the case in which a plurality of electrodes on the chip pieces are connected. Among various types of the anisotropic conductive adhesives, some of them containing relatively large amount of conductive metal fine powder, (for example, approximately 75% by volume) have less adhesive force than required, resulting in a new problem of separation of the chip pieces. Thus, it is likely that the chip pieces 50 which are mounted by using the anisotropic conductive adhesive are separated from the circuit board 55 due to mechanical shocks applied to the devices and appliances, temperature changes, secular deterioration, etc., resulting in a serious problem of failure of operation of the devices and appliances.

In a case in which the anisotropic conductive adhesive S is applied to a predetermined position or portion of the circuit board where the chip pieces 50 are mounted, a sufficiently large adhesion area is required to overcome the problem of insufficient adhesive force described above. However, it is difficult to secure a sufficient area for adhesion in view of requirements for a high-density mounting. Furthermore, when chip pieces are miniaturized/thinned and mounted on an IC card and the like, it is likely that the IC card or the like is short-circuited due to external shocks to the IC card or the like and a mechanical pressure due to folding the IC card or the like, and that it is corroded by an external impurity ion.

SUMMARY OF THE INVENTION

In view of the foregoing, it is an object of the present invention to provide a new electronic component for adhesion of a plurality of electrodes, and a new method of mounting the same.

Another object of the present invention is to simplify installation or mounting of miniaturized and thinned electronic component having a plurality of electrodes onto a circuit board to thereby improve working efficiency and an adhesive force of the electronic component, so that short-circuit problems caused by external shocks and corrosion can be eliminated to prevent generation of off-specification products and, at the same time, to enable the electronic component to be preserved, maintained and transported.

According to a first aspect of the present invention, there is provided electronic component for connecting a plurality of electrodes, comprising: an insulative base having a plurality of electrodes and spaces therebetween, an anisotropic conductive adhesive agent applied to the electrodes, an insulative adhesive agent having the same curing condition as a curing condition of the anisotropic conductive adhesive agent, and the insulative adhesive agent is applied on to the spaces. Each of the anisotropic conductive adhesive agent and the insulative adhesive agent is temporarily cured.

The invention described above permits relatively weak adhesive force of the anisotropic conductive adhesive agent to be strengthened and supplemented by the insulative adhesive agent without using a chip cover and the like because the anisotropic conductive adhesive agent is applied to the electrode portion on the base of the chip pieces, and because the insulative adhesive agent is applied to portions other than the electrode on the base. Thus, the chip pieces can be firmly adhered and held in position.

A second aspect of the present invention provides an electronic component for connecting a plurality of electrodes, comprising: an insulative chip cover with a radiating portion and having a housing portion on a lower surface thereof, a flip chip piece composed of a base having a plurality of electrodes of a semiconductor arranged on a back surface, and accommodated in the housing portion, an anisotropic conductive adhesive agent applied or screen-printed on the electrodes of the base of the chip piece, a bonding surface on a circumference of the chip piece and on a lower surface of the insulative chip cover, an insulative adhesive agent having the same curing condition as a curing condition of the anisotropic conductive adhesive agent, and applied or screen-printed on to the bonding surface. Each of the anisotropic conductive adhesive agent and the insulative adhesive agent is press-heated for a predetermined time to be temporarily cured.

In the second aspect of the invention described above, the radiating portion can be formed with an opening portion by extending at least one end portion of the chip cover outwardly. Further, the insulative adhesive agent has a similar temperature property as the anisotropic conductive adhesive agent having a property of being responsive to a heating temperature and changed from a temporarily cured state to a cured state.

Accordingly, the chip pieces can be securely mounted in position to the circuit board, so that any damage or separation of the chip pieces due to external shocks can be prevented effectively. Further, this permits transportation or preservation of the electronic component in a state of an immediate use.

In a third aspect of the present invention, there is provided a method of mounting an electronic component for connection of a plurality of electrodes, comprising the steps of: accommodating a flip chip piece in a chip cover, wherein the flip chip piece has a semiconductor element with a plurality of electrodes arranged in a planar fashion, and the housing portion is provided on a lower surface of a chip cover made of an insulative material and having a radiating portion, applying or screen-printing an anisotropic conductive adhesive agent to a plurality of electrodes provided on a base of the chip piece, and applying or screen-printing an insulative adhesive agent having the same curing condition as that of the anisotropic conductive adhesive agent to a bonding surface of the chip cover, heat-pressing the anisotropic conductive adhesive agent and the insulative adhesive agent for a predetermined time to temporarily cure the anisotropic conductive adhesive agent and the insulative adhesive agent to thereby produce predetermined electronic component, locating the electronic component at a position on a circuit board having substrate electrodes arranged to be aligned with the electrode of the chip piece to provide a predetermined positioning of the electrodes and the substrate electrodes, and mounting a crimping tool on the chip cover and lowering the crimping tool as the above-mentioned two types of the adhesive agents are being hot melted to press the chip cover on to the circuit board for a predetermined time to electrically connect the aforementioned two types of electrodes with each other.

Accordingly, the present invention permits separation of the mounting-assembly step of the circuit board from the application step of the adhesive agents. This enables an improvement in the working efficiency and reliable, long-term preservation of the electronic components which are available for immediate mounting, and this enables easy transportation or movement of the electronic component for mounting purposes to thereby establish an efficient mounting operation.

BRIEF DESCRIPTION OF THE DRAWINGS

Other features and advantages of the present invention will appear more clearly upon reading the following detailed description, made with reference to the annexed drawings in which.

PREFERRED EMBODIMENTS OF THE INVENTION

Preferred embodiments of the present invention will be described with reference to the accompanying drawings.

Referring first to FIGS. 1 through 7, the electronic component is composed of a flip chip piece 11 and a chip cover 20 for protecting the chip piece 11. The chip piece 11 has a base 12 which serves as an electrode surface, on which an anisotropic conductive adhesive agent S is applied (or, coated) in the state of being semi-cured or temporarily cured. The chip cover 20 has a bonding surface 24 at a circumferential portion on the lower surface thereof, on which an insulative adhesive agent M is applied (or, coated), and heat-pressed to provide a temporary curing.

Figure 1:
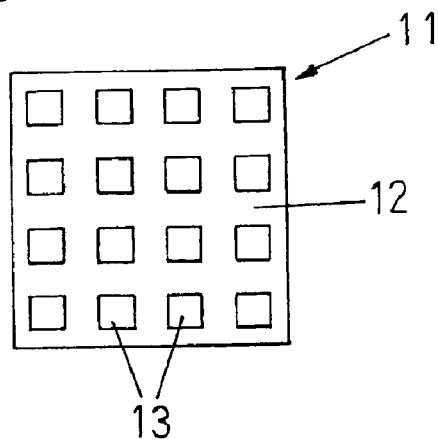
FIG. 1 is a bottom view of a flip chip piece.

Referring now to FIG. 1, on a base 12 of a chip piece containing therein a semiconductor, a plurality of electrodes (bumps) 13 connected with the semiconductor are arranged in position. Since the electrode 13 is connected with a substrate electrode 31 on a surface of a circuit board 30 shown in FIG. 14, an area of the chip piece 11 occupied on the circuit board 30 can be made equal to that of the chip piece 11 to thereby establish small-sizing and lightening of the circuit board 30. However, a large amount of conductive metal fine powder is added to the anisotropic conductive adhesive agent S applied to the surface of the plurality of electrodes on the chip piece 11 and, therefore, its adhesive force is inevitably decreased. Besides the above, the electrodes are preferably projected slightly above the base surface or otherwise, if necessary, can be made flush with the surface without any projection.

Figure 2:
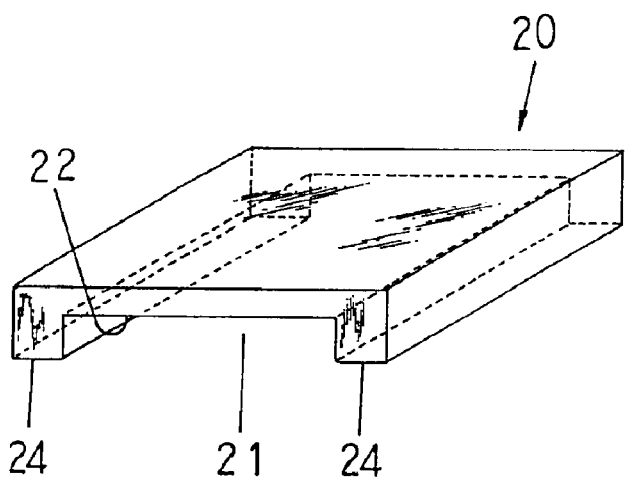
FIG. 2 is a perspective view of a chip cover.
Figure 3:
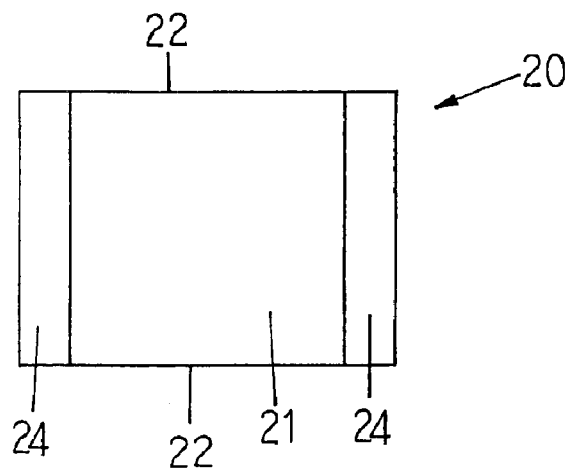
FIG. 3 is a bottom view of the chip cover.
Figure 4:
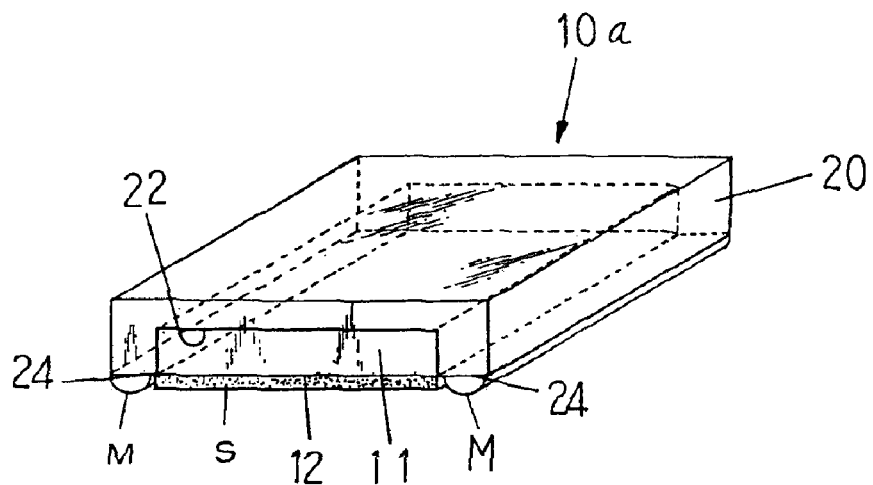
FIG. 4 is a perspective view of an electronic part according to a first embodiment of the invention, wherein the electronic part is in a condition of a pre-temporary curing process.
Figure 5:
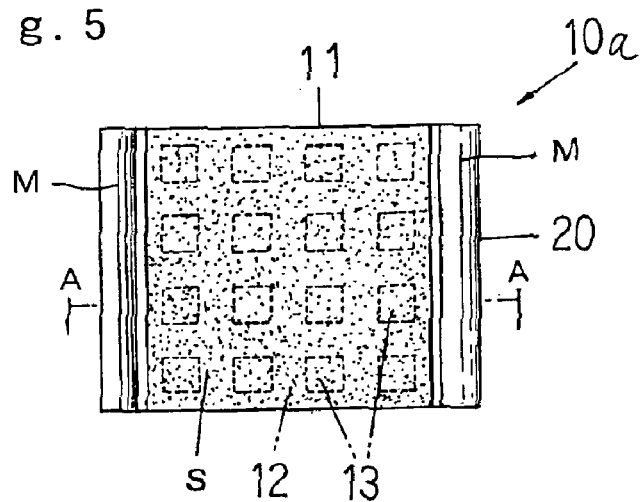
FIG. 5 is a bottom view of the electronic component shown in FIG. 4.
Figure 6:
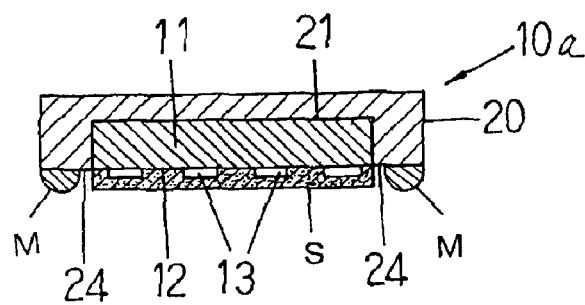
FIG. 6 is a sectional view of the electronic component, taken along line A—A in FIG. 4.
Figure 7:
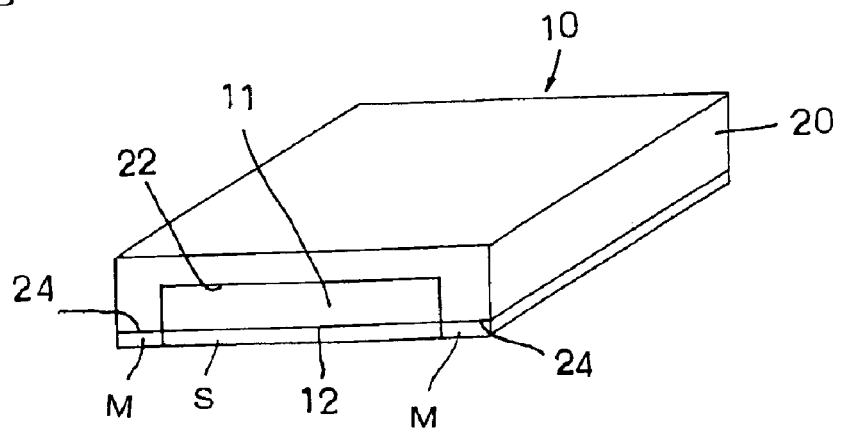
FIG. 7 is a perspective view of the electronic part after it is temporarily cured.

With reference to FIGS. 2 and 3, the chip cover 20 is made of insulative materials, preferably of insulative synthetic resins and has at its bottom surface a housing portion 21 for securing therein or accommodating the chip piece 11. The housing portion 21 is provided with a radiating portion 22 which communicates with the outside to radiate the heat generated in the housing portion. Further, the chip cover 20 has, at the circumference of the housing portion 21, the bonding surface 24 at least on the opposed sides of the bottom surface of the chip cover 20 for application of the insulative adhesive agent M on the bonding surface 24.

The housing portion 21 is provided with a radiating portion 22 which is composed of an opening extending to the outside of the chip cover at the left and right surfaces and/or the front and rear surfaces, so that the heat generated from the chip pieces 11 in the housing 21 is released outside through the radiating portion 22 to prevent overheat of the chip piece. In this case, instead of providing the radiating portion 22 at the chip cover 20 as described above, suitable radiating ribs or projections (not shown) may be provided on the surface of the cover.

The chip piece 11, which is secured in the housing portion 21 of the chip cover 20, is adhered or mechanically fitted unitarily to the interior of the housing portion 21. Thus, when electronic component 10a is mounted on or adhered to the circuit board 30 before the temporary curing process, the chip cover 20 can be moved to regulate the position thereof in the back and forth direction and the left and right direction to adjust the position of the chip piece. In other words, since the electronic component is in the temporary cured condition, a relative position between the projected electrodes 13 of the chip piece 11 and the substrate electrodes 31 is easily adjusted at the time of energizing check to prevent generation of inferior electronic component.

The bonding surface 24 on the opposite sides of the lower surface of the chip cover 20 is formed as being on substantially the same plane of, and flush with, the surface of the base 12 which serves as an electrode surface of the chip piece 11. The bonding surface 24 is provided with a generally known insulative adhesive agent M and the base 12 of the chip piece is provided with an anisotropic conductive adhesive agent S, and these adhesive agents M and S are provided simultaneously or otherwise separately by application such as by coating or by screen printing.

The anisotropic conductive adhesive agent S has conductivity only in the pressurized direction as described above, and does not exhibit conductivity but maintains insulation in the non-pressurized direction. To this end, it is preferred to use an anisotropic conductive adhesive agent produced by FineChem Technical Laboratory, Ltd. (in the product name of Fine Eposeal 5001) in such a manner that the adhesive agent is coated or screen printed (hereinafter, a word "application" and its synonyms will be used for meaning both coating and printing) by using a suitable dispenser to provide 20–30 microns in the thinnest order and 150–200 microns in the thickest order entirely to the base 12 of the chip piece 11.

After the anisotropic conductive adhesive agent S is applied to the base 12 of the chip piece 11, the anisotropic conductive adhesive agent S is press-heated by means of crimping tool X at a predetermined temperature and pressure for a predetermined time so that both adhesive agents S and M are temporarily cured. The heat treatment of the anisotropic conductive adhesive agent will preferably be conducted at a relatively low temperature of about 70° C. for about 1–3 hours at a predetermined pressure. The time for heating and pressurization would be important while the pressure condition, and 0.7–1.0 kg/cm$^2$ is an example of the pressure, although not limited to this range because it depends upon the kinds of applied adhesive agents, room temperature, etc.

The insulative adhesive agent M applied to the bonding surface (bonding surface) 24 of the chip cover 20 serves to prevent the electronic parts from being separated or displaced from the circuit board 30. The insulative adhesive agent M is required to have a B-staging condition of the anisotropic conductive adhesive agent S, that is, a similar temperature property as the anisotropic conductive adhesive agent having a property of being reactive to a heating temperature and changed from a temporarily cured state to a cured state. For example, in a case in which a reactive temperature for curing the anisotropic conductive adhesive agent S is 70° C., the insulative adhesive agent is required to be reactive at the same temperature. This will permit a great amount of the conductive metal fine powder to be adhered to thereby reinforce the anisotropic conductive adhesive agent having less adhesive force by the use of the insulative adhesive agent M, and this will prevent generation of inferior products.

The B-stage type adhesive agent intends to mean an adhesive agent that is cured (that is, non-reactive but cured in an apparent state) when it is placed under the predetermined conditions of temperature, pressure, etc., and adaptable and compatible to transportation, preservation, contacts parts other than the predetermined connecting portions. Further, when the other conditions (such as high temperature and high pressure, in general) are given continuously for a predetermined time, it can be returned to a liquid state (that is, re-softened) and, after the reaction, solidified for adhesion.

By use of the insulative adhesive agent M which has the same curing conditions as the anisotropic conductive adhesive agent S, both the anisotropic conductive adhesive agent S and the insulative adhesive agent M are heat-pressed by means of the crimping tool to be temporarily cured. The pressure and temperature in the heat-press process for the insulative adhesive agent is, similar to those of the anisotropic conductive adhesive agent, approximately 70° C., and a predetermined pressure is added for 1–3 hours to provide temporary curing. The specific pressure is, for example, 0.7–1.0 kg/cm$^2$ which, however, is not restrictive in the present invention but changeable depending upon the kinds of applied adhesive agents and the temperature.

The application and temporary curing of the two kinds of adhesive agents S and M may be conducted either before or after the chip piece 11 is mounted on the chip cover 20. Preferably, the application of the adhesive agents are conducted after the chip piece is mounted on the chip cover 20, and this will be convenient because the application of the adhesive agent and the heating/pressurizing step can proceed at a time in a continuous procedure. Further, when a thinned and small-sized electronic component 10 is mounted on, for example, an IC card, the chip cover 20 mounted to the chip piece can prevent damages and short-circuit problems due to external shocks and mechanical external forces generated when the IC card is bent or folded, and penetration of impurity ions, etc.

Figure 8:
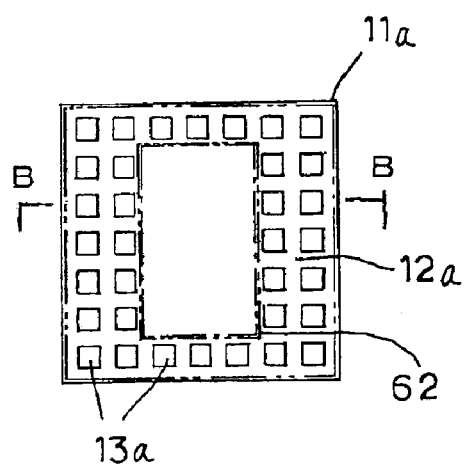
FIG. 8 is a bottom view of the chip piece according to a second embodiment of the present invention.
Figure 9:
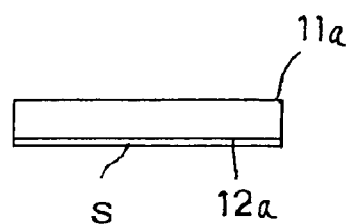
FIG. 9 is a plan view of the chip piece shown in FIG. 8.
Figure 10:
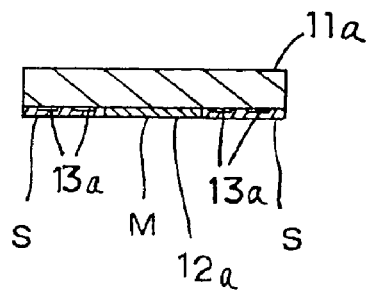
FIG. 10 is a sectional view of the chip piece, taken along line B—B in FIG. 8.

A second embodiment of the invention will be described with reference to FIGS. 8–10. A relatively large-sized chip piece 11a with semiconductors included therein is prepared, and a plurality of electrodes 13a are disposed on a circumferential portion of a rear surface of the base 12a to form an electrode portion 60, to which the anisotropic conductive adhesive agent S is applied or screen-printed. On an air space (i.e., space portion) 62 positioned inside the electrodes 60 is applied or screen-printed the insulative adhesive agent M which has the same curing condition as the anisotropic conductive adhesive agent.

Figure 11:
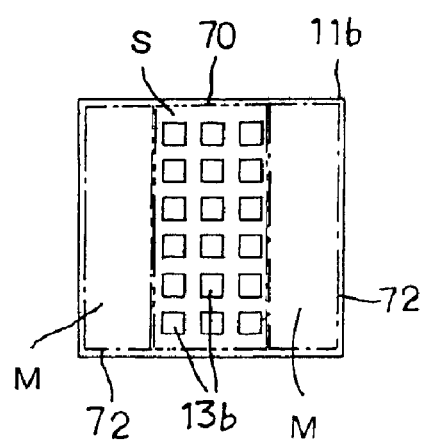
FIG. 11 is a bottom view of the chip piece according to a third embodiment of the invention.
Figure 12:
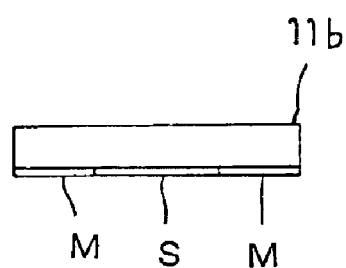
FIG. 12 is a plan view of the chip piece shown in FIG. 11.

FIGS. 11 and 12 show a third embodiment of the invention. In this embodiment of the invention, a plurality of electrodes 13b are disposed on a central portion of the base 12b of the chip piece 11b to form an electrode portion 70 to which the anisotropic conductive adhesive agent S is applied or screen-printed. On an air space (space portion) 72 positioned on both sides of the base 12b is applied or screen-printed the insulative adhesive agent M which has the same curing condition as the anisotropic conductive adhesive agent.

As described above, the electrode portions 60, 70 are provided on the base 12a, 12b of the chip piece, and anisotropic conductive adhesive agent S is applied to the electrode portions 60, 70 where the electrodes 13a, 13b are positioned. The insulative adhesive agent M is applied to the space portion 62, 72 where no electrode is disposed. The electronic component with the adhesive agents S, M temporarily cured can be heated and cured for mounting. Since the chip piece has a certain size, provision of the air space having no electrode allows the chip piece to be mounted without using the chip cover.

Figure 13:
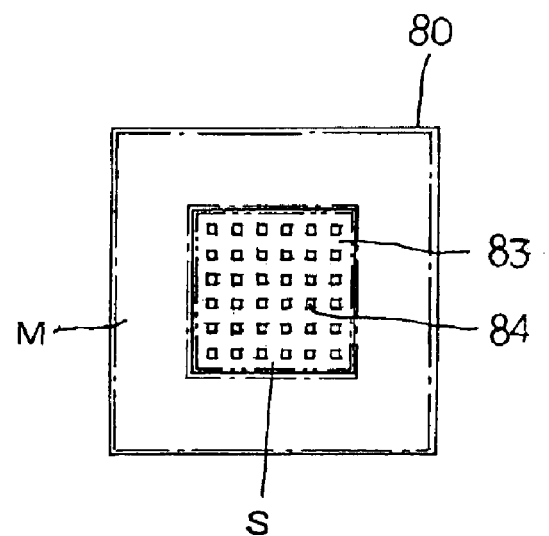
FIG. 13 is a bottom view of an LSI according to a fourth embodiment of the present invention.

Referring to FIG. 13 which shows a fourth embodiment of the present invention, an LSI socket 80 available in the market has, at its central portion, a housing portion for mounting therein an LSI 83 which has a plurality of electrodes 84 on its rear surface to form an electrode portion. An anisotropic conductive adhesive agent S is applied to the electrode portion of the electrodes 84 and the two types of adhesive agents are temporarily cured. The socket 80 for the LSI 83 serves substantially the same purpose as the chip cover 20 in the previous embodiment. Namely, since the anisotropic conducive adhesive agent S applied to the LSI portion has less adhesive force, the weak adhesion is reinforced by the insulative adhesive agent M which is applied to the base of the socket 80, and the socket 80 can be mounted on the circuit board without using an LSI socket cover.

Figure 14:
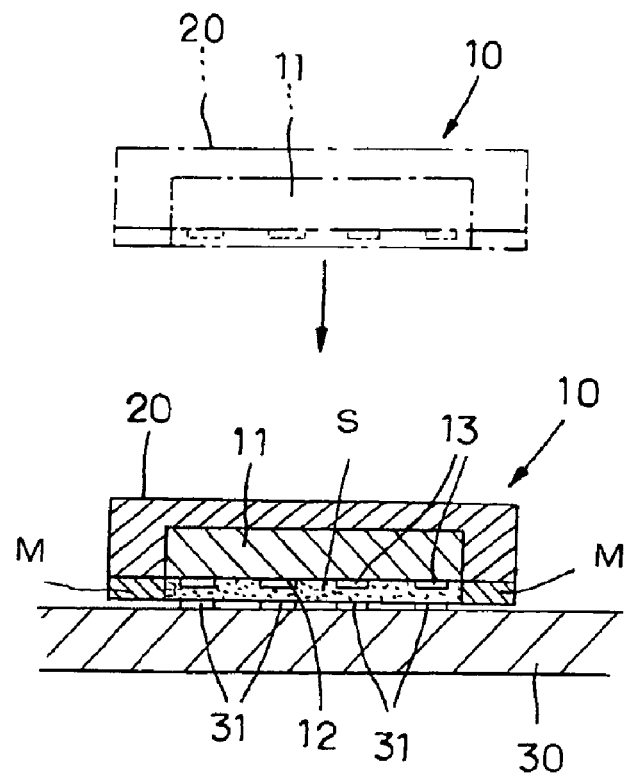
FIG. 14 is an explanatory sectional view of the electronic component on the circuit board, showing a pre-mounted state and a packages state of the electronic component relative to the circuit board.

For the purpose of mounting the electronic component with the adhesive agents S and M being temporarily cured on the circuit board, as shown in FIG. 14, a electrode 13 on the base 12 of the electronic component 10a having the chip pieces 11a, 11b and 80 or the electronic component 10 having chip piece 11 and the chip cover 20 is positioned in a confronting relation with the substrate electrodes 31 projecting from the circuit board. Thereafter, the electrodes 13 are lowered as shown by an arrow in FIG. 14 toward the circuit board 30 so that the electrodes on both sides are positioned in alignment with each other.

Figure 15:
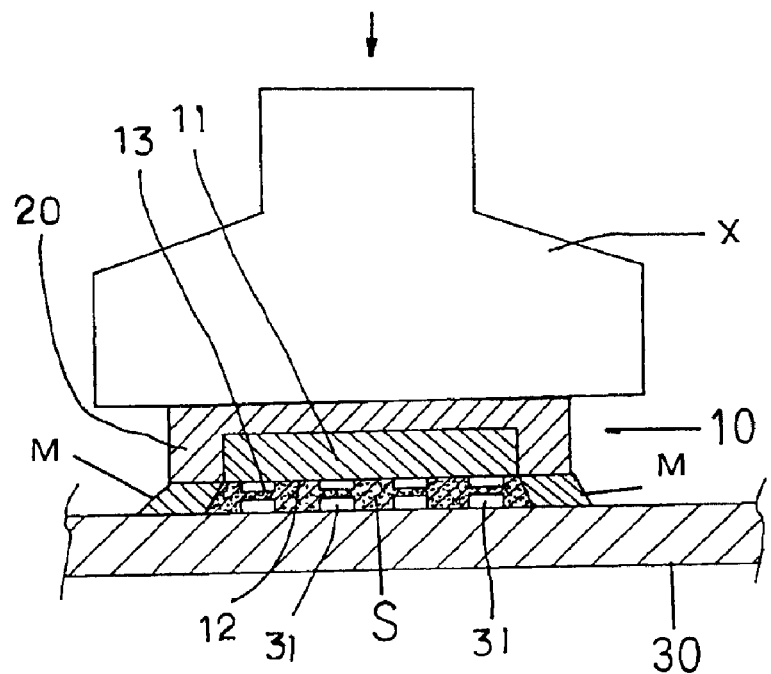
FIG. 15 is an explanatory sectional view showing that the electronic component is heat-pressed on the circuit board by means of a heat-press tool.
Figure 16:
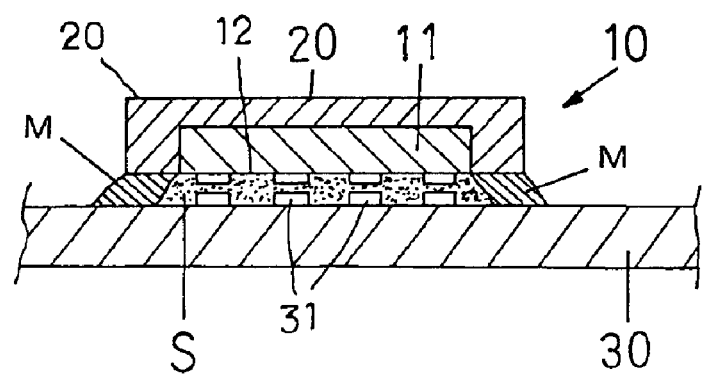
FIG. 16 is a sectional view of the electronic component and the circuit board, showing the electronic component crimped and mounted on the circuit board.
Figure 17:
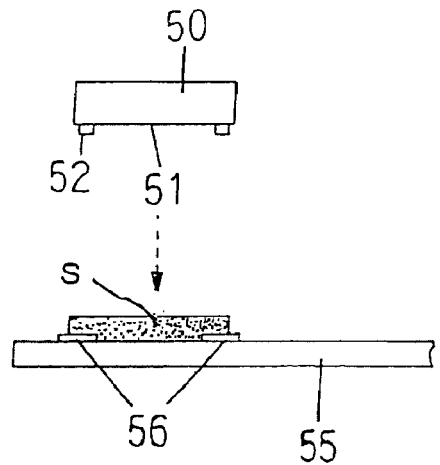
FIG. 17 is a front view of the conventional chip piece, showing a state before the chip piece is mounted on the circuit board according to the prior art technique.
Figure 18:
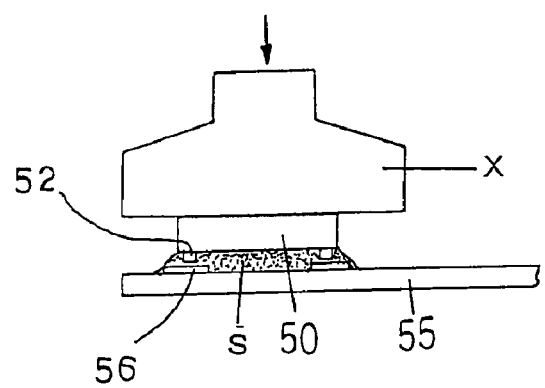
FIG. 18 is a front view of the conventional electronic component showing the state that the electronic component is heat-pressed and crimped on the circuit board according to the prior art technique.
Figure 19:
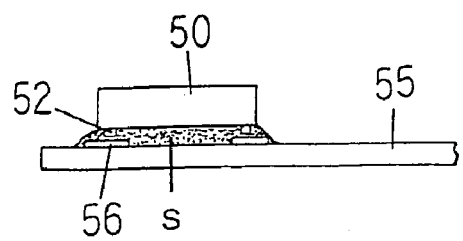
FIG. 19 is a front view of the conventional electronic component mounted on the circuit board according to the prior art technique.

As illustrated in FIG. 15, the electronic component 10 with the adhesive agents S and M being temporarily cured is heated at a predetermined temperature by the crimping tool X to be softened or returned to the uncured condition. Then, the crimping tool X is pressed downward so that the lower surface of the softened adhesive agents S and M contact an upper surface of the circuit board 30. Thus, the anisotropic conductive adhesive agent S positioned at a central lower portion of the electronic component 10 is crimped between the electrodes 13 and 31 to establish an electrical connection. On the other hand, no vertical pressure is added to the laterally adjacent electrodes and, therefore, the insulative nature is maintained between the laterally adjacent electrodes. Thus, the laterally adjacent electrodes are not electrically connected with each other.

The adhesive agent S and M that have been uncured or re-softened by means of the crimping tool X are pressurized in the vertical (that is, up-down) direction and then extended in the lateral direction. Specifically, the adhesive agent S located between the electrodes 13 and 31 becomes electrically conducted when it is pressed with a predetermined amount of pressure, but encloses laterally the electrodes to provide an electrically insulative state. The insulative adhesive agent M located outside the anisotropic conductive adhesive agent S is forcibly expanded in the lateral (right and left) direction by the anisotropic conductive adhesive agent S and extruded in the lateral direction from the lower surface of the chip cover 20. Therefore, an adhesive area is increased by the extended part of the adhesive agent S, with the result that an adhesive force is increased.

If the chip piece 11 is heated, for example, at about 150° C. with the chip piece 11 being held by the crimping tool and pressurized for a predetermined time, both of the adhesive agents S and M are re-cured to provide a batch connection between the electrodes 13 and 31. In other words, pressure is added between the electrode 13 of the chip piece in the direction of ups and lows (i.e., the vertical direction) and the electrode 31 of the circuit board to electrically connect the electrodes 13 and 31. Accordingly, if the anisotropic conductive adhesive agent S is applied to the predetermined position on the surface of the circuit board 30 and temporarily cured, mounting of the electronic component 10 can be realized easily.

Now, the mounting steps for the electronic component according to the present invention will be described with reference to the drawings. In the first step, the chip piece 11 is fixed inside the housing portion 21 of the chip cover 20, and the chip piece 11 fixed inside the housing portion 21 of the chip cover 20 is adhered to or engaged with the housing portion 21 in a unitary structure, and the housing portion 21 has a radiating portion 22 for releasing the heat outside.

In the second step, the anisotropic conductive adhesive agent S is applied to the base 12 of the chip piece 11, and the insulative adhesive agent M is applied to the bonding surface 24 of the chip cover 20. In this case, a first printing pattern (not shown) for the anisotropic conductive adhesive agent and a second printing pattern (not shown) for the insulative adhesive agent are used to form the adhesive agents S and M, but the method is not limited to this step of production. At least the adhesive agent S is formed in a thicker configuration so that both of the electrodes can be embedded therein. The adhesive agents are applied by using a dispenser or printed by a screen printing technique. A thickness of a layer of the anisotropic conductive adhesive agent S applied to the surface of the base may be selectively determined from a range of 20–30 microns to a range of 150–200 microns.

In the process of applying the adhesive agents S and M, the application (or screen printing) of the anisotropic conductive agent S to the base 12 of the chip piece 11 can proceed simultaneously or otherwise sequentially with respect to the application (or screen printing) of the insulative adhesive agent M to the bonding surface 24 of the chip cover 20. The anisotropic conductive adhesive agent S applied on the base 12 of the chip piece 11 and the insulative adhesive agent M on the bonding surface 24 of the chip cover 20 can be heat-pressed by a known device or the crimping tool X for temporarily curing to produce the electronic component 10 for the adhesion of a plurality of electrodes.

It is required that the anisotropic conductive adhesive agent S and the insulative adhesive agent M are similar with each other in respect of a pressurizing force and a heating temperature, if they are of the same epoxy resin type. Besides, the pressurizing and heating temperature for temporarily curing the adhesive agents S and M is, preferably, approximately 70° C. with a certain pressure of, for example 0.7–1.0 kg/cm$^2$ being continuously added for 1–3 hours, but the present invention is not limited to such a pressure and temperature as described above.

In the third step, as shown in FIG. 14, positioning between the electrodes 13 on the chip piece 11 of the electronic component 10 with the adhesive agents S and M being temporarily cured and the substrate electrodes 31 on the circuit board 32 is made by aligning the electrodes 13 with the substrate electrodes 31. A common method of this positioning may be used to lower the electronic component 10 in the vertical direction but, if necessary, the electronic component 10 can be moved in the lateral direction.

At the time of this positioning, the lower surface of the temporarily cured anisotropic conductive adhesive agent S is aligned with the substrate electrodes 31 as shown in FIG. 14. In this case, it is a matter of course that, for the purpose of facilitating the mounting procedure, the adhesive agent may be heated simultaneously with the start of lowering the electronic component 10 to thereby make the temporarily cured adhesive agent be melted. Besides, when positioning of the electronic component 10 is made to proceed curing of the adhesive agent, the electronic component 10 is contacted with the crimping tool X as shown in FIG. 15 to start the heating.

In the fourth step, as shown in FIG. 15, when the electronic component 10 aligned with the upper surface of the substrate electrode 31 are heated at, for example, 150° C. by means of the crimping tool X, the adhesive agent is melted into a re-softened state. In this state, the crimping operation is made by applying a certain force from above for 1–3 hours so that the electronic component 10 is adhered to the substrate electrodes 31 of the circuit board 30. By this step, the electrodes 13 and 31 which are positioned at upper and lower portions are electrically connected with each other due to the effect of the anisotropic conductive adhesive agent S.

Since a relatively large amount of conductive metal fine powder is added to the anisotropic conductive adhering agent S, its adhesive force is deteriorated. The circuit board 30 is adhered with the chip cover 20 which is positioned around or at both sides of the chip piece, and an adhesive force between the electronic component 10 and the circuit board 30 is further increased.

As described above, two kinds of adhesive agents S and M applied to the chip piece and the bonding surface of the chip cover are temporarily cured to provide the electronic component 10 so that the electronic component 10 can be mounted on the circuit board 32. Therefore, in the process of producing a module circuit, the mounting/assembly step can completely be separated from the application step of the adhesive agent(s), and this allows an increase in the working efficiency and extended application in production method and logistics. The electronic component 10 with the adhesive agents being temporarily cured allows a long term preservation, specifically, for 3 months at room temperature, 6 months by cold storage and about 1 year by refrigeration, and can be mounted instantly when necessary.

The thus-produced electronic component 10 is transportable and therefore distributed by and through sales networks as a commercial product. Thus, the difficult process of application of the adhesive agent to the circuit board is no longer required at the time of the mounting procedure and, therefore, the mounting process for the electronic component can be achieved without difficulties. Thus, improvements in a working efficiency and a yield rate can be achieved to provide economic efficiency.

According to the present invention, the insulative adhesive agent is applied to a part of the chip piece or the bonding surface of the chip cover, and the anisotropic conductive adhesive agent is applied to the electrodes which are provided on the base surface of the chip piece. Therefore, adhesive agents can be temporarily cured to provide the electronic component. The electronic component thus formed is adaptable to a long term preservation and transportation, and adaptable to a sales network as a commercial product. Further, the present invention allows separation of production steps between the mounting/assembly and the application of adhesive agents, and an application of the adhesive agents, at the time of mounting, can be omitted. Thus, a further improvement in working efficiency for a mounting operation can be realized to thereby provides merits and advantages in extensive applications of mounting method and logistics.

What is claimed is:

1. An electronic component comprising:
    an insulative chip cover having a housing section in a lower surface thereof, and having a bonding surface on said lower surface;
    a flip chip including a base and a plurality of electrodes on an electrode surface of said base, said chip being accommodated in said housing portion of said chip cover;
    an anisotropic conductive adhesive agent applied to said electrodes of said chip;
    an insulative adhesive agent applied to said bonding surface of said chip cover, said insulative adhesive agent having the same curing condition as said anisotropic conductive adhesive agent, each of said anisotropic conductive adhesive agent and said insulative adhesive agent being press-heated for a predetermined length of time so as to be in a temporarily cured state.

2. The electronic component of claim 1, wherein said chip has a bonding surface on a periphery of said electrode surface, said insulative adhesive agent being applied to said bonding surface of said electrode surface.

3. The electronic component of claim 1, wherein said anisotropic conductive adhesive agent is screen-printed onto said electrodes, and said insulative adhesive agent is screen-printed onto said bonding surface.

4. The electronic component of claim 1, wherein said chip cover has a radiating portion.

5. The electronic component of claim 4, wherein said radiating portion comprises an opening on at least one end surface of said chip cover so as to communicate with an exterior of said chip cover.

6. The electronic component of claim 1, wherein each of said anisotropic conductive adhesive agent and said insulative adhesive agent is responsive to a predetermined heating temperature so as to be changed from said temporarily cured state to cured state.

7. The electronic component of claim 1, wherein no insulative adhesive agent is applied to said electrodes.

8. A method of mounting an electronic component, comprising:

accommodating a flip chip in a housing portion in a lower surface of an insulative chip cover, the flip chip having a semiconductor element with a plurality of electrodes arranged in a planar manner, the chip cover having a bonding surface on the lower surface thereof;

applying an anisotropic conductive adhesive agent to the electrodes;

applying an insulative adhesive agent to the bonding surface of the chip cover, the insulative adhesive agent having the same curing condition as the anisotropic conductive adhesive agent;

heat-pressing the anisotropic conductive adhesive agent and the insulative adhesive agent so as to temporarily cure the anisotropic conductive adhesive agent and the insulative adhesive agent to thereby form a mountable electronic component;

positioning the mountable electronic component on a circuit board having substrate electrodes so that the electrodes of the flip chip are aligned with the substrat electrodes;

mounting a crimping tool on the chip cover; and pressing the crimping tool against the chip cover while heating the mountable electronic component so as to hot-melt the anisotropic conductive adhesive agent and the insulative adhesive agent and so as to press the mountable electronic component against the circuit board to thereby electrically connect the electrodes of the flip chip to the substrate elecrodes.

9. The method of claim 8, wherein said applying of the anistropic conductive adhesive agent to the electrodes comprises screen-printing the anisotropic conductive adhesive agent onto the electrodes, and said applying of the insulative adhesive agent to the bonding surface of the chip cover comprises screen-printing of the insulative adhesive agent onto the bonding surface of the chip cover.

10. The method of claim 8, wherein the chip cover has a radiating portion.

11. The method of claim 8, wherein said applying of the insulative adhesive agent includes applying no insulative agent to the electrodes.

12. An electronic component to be mounted on a circuit board, said electronic component comprising:

an insulative base having a mounting surface;

an electrode portion on said mounting surface, said electrode portion including at least one electrode;

a space portion on said mounting surface, said space portion have no electrodes;

an anisotropic conductive adhesive agent applied to said electrode portion; and an insulative adhesive agent applied to said space portion, said insulative adhesive agent having the same curing condition as said anisotropic conductive adhesive agent, each of said anisotropic conductive adhesive agent and said insulative adhesive agent being in a temporarily cured state.

13. The electronic component of claim 12, wherein said electrode portion is located at a center of said mounting surface of said insulative base, and said space portion is located around said electrode portion.

14. The electronic component of claim 12, wherein said space portion is located at a center of said mounting surface of said insulative base, and said electrode portion is located around said space portion.

15. The electronic component of claim 12, wherein said electrode portion includes a plurality of electrodes spaced apart at predetermined intervals.

16. The electronic component of claim 12, wherein the circuit board has at least one projecting electrode corresponding to said at least one electrode of said electrode portion.

17. The electronic component of claim 12, wherein no insulative adhesive agent is applied to said at least one electrode of said electrode portion.

* * * * *